(12) United States Patent
Monnet et al.

(10) Patent No.: US 6,465,790 B1
(45) Date of Patent: Oct. 15, 2002

(54) MICRO GAMMA CAMERA WITH SEMICONDUCTING DETECTORS

(75) Inventors: Olivier Monnet, Tullins; Alain Chapuis, St Marku-le-Viuoux; Corinne Mestais, La Terrasse; Jean-Pierre Rostaing, La Côte Saint-André, all of (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 09/558,490

(22) Filed: Apr. 26, 2000

(30) Foreign Application Priority Data

Apr. 30, 1999 (FR) .............................. 99 05526

(51) Int. Cl.⁷ .............................................. G01T 1/24
(52) U.S. Cl. .................................. 250/370.09; 250/370
(58) Field of Search ....................... 250/370.9, 370.08, 250/370.01, 214.1, 207, 225, 214 R

(56) References Cited

U.S. PATENT DOCUMENTS

| | | | |
|---|---|---|---|
| 5,381,014 A | 1/1995 | Jeromin et al. | 250/370.09 |
| 5,742,060 A | 4/1998 | Ashburn | 250/370.09 |
| 6,194,715 B1 * | 2/2001 | Lingren et al. | 250/370.09 |

FOREIGN PATENT DOCUMENTS

| | | |
|---|---|---|
| EP | 0 657 938 A1 | 1/1995 |
| EP | 0 872 896 A1 | 10/1998 |

OTHER PUBLICATIONS

IEEE Transactions on Nuclear Science, Arques et al., A Basic Component for ISGRI, the CdTe Gamma Camera on Board the Integral Satellite, Jun. 1999, vol. 46, Issue 3, pp.181–186.

WO 96/20412, Semiconductor Gamma–Ray Camera and Medical Imaging System, Jul. 1996.

* cited by examiner

*Primary Examiner*—Hung Xuan Dang
(74) *Attorney, Agent, or Firm*—Pearne & Gordon LLP

(57) ABSTRACT

A micro gamma camera having several gamma radiation detection devices adjacent to each other. The detection devices are laid out above an information processing device that processes information output by the detection devices. Each of the detection devices includes: a plurality of detectors positioned adjacent to each other to form a detection plane; a first substrate including a detection plane polarizer and a first signal processor for processing the signal detected by the detection plane; a second substrate placed between the detection plane and the first substrate; a ground plane placed between the first and second substrates; and a third substrate including second and third signal processors.

8 Claims, 3 Drawing Sheets

MICRO GAMMA CAMERA WITH SEMICONDUCTING DETECTORS

DESCRIPTION

1. Field of the Invention

The invention relates to a micro gamma camera with semiconducting detectors locally and instantaneously outputting the detected image.

This gamma camera is used in all technical fields in which the camera dimensions are very important. In particular, it is used in applications in the medical field, and more precisely for surgery.

2. State of the Art

In the medical field, and particularly in surgery, it is useful to be able to display the area(s) to be treated before starting or during the treatment. For example, a surgeon who needs to extract cancerous parts of tissues from a patient may display these parts of tissues before removing them.

At the present time, pre-operational probes are known in which the detector is made using crystals coupled on a positioning photomultiplier. However, this type of detector is too bulky and too heavy to be used in surgery.

Detector solutions are emerging based on small crystals coupled to a semiconductor. But there are sensitivity problems with these detectors at the high energy of photons used in nuclear medicine. These detectors are aimed particularly for energy ranges below 100 keV, to measure the integral of the photon flux and deposited energy.

Furthermore, gamma cameras are available in other technical fields, made using detection devices themselves including a set of detectors placed adjacent to each other and forming a detection plane supported by a substrate and separated from this substrate by a connection plate. For example, a gamma camera of this type is described in patent request WO-96/20412. However, these gamma cameras are usually fairly large, in other words of the order of 30 to 40 cm by 40 to 50 cm.

Another type of detection device that can be used on a gamma camera is also known. This detection device is composed of a plurality of detectors placed side by side on a ceramic substrate to form a detection plane. The purpose of the ceramic substrate is to provide mechanical strength for the overall device.

This type of detection device cannot operate unless it is polarized. In order to do this, the device is provided with polarization means, such as a connecting resistor and capacitor; the resistor is connected to the ground when the detector is connected to the high voltage and vice-versa. These polarization means are placed on the surface of the ceramic substrate.

This detection device also comprises means of processing signals from the detectors; these processing means are in the form of an ASIC (Application Specific Integrated Circuit) located in the substrate.

The ceramic substrate in this known detection device is thin, so that it is transparent to the γ rays that are to be detected in the detection plane located under the substrate. The substrate is also thin such that the measurement ASIC can be placed as close as possible to the detection plane, in order to minimize parasite capacitances in the link between the detection plane and the input to the ASIC.

Furthermore, it is known that the polarization means for this type of device must be placed on the shortest path between the detection plane and the ASIC. Thus, since the substrate is thin, the polarization resistor and capacitor are implanted on the substrate surface by silk screen printing.

A detection device of this type is described in particular in the publication entitled "A Basic Component for ISGRI, the CdTe gamma camera on board the INTEGRAL Satellite" by M. ARQUES et al. The detection device described in this publication is applied to a satellite. In this special case, the detection device comprises two detection stages for two energy ranges. A measurement ASIC is installed on this detection device so that it is close to the detectors in order to minimize parasite capacitances of the link between the detectors and the input to the ASIC. In this device, noise related to the information processing electronics in no way hinders the detection of signals. Furthermore, this noise may be high compared with the very low electrical charges being measured. Furthermore, the noise and the signal to be measured are synchronous. Consequently, measurement and electronic processing times are sequenced; the signal processing electronics is inhibited during the time that a photon is being measured. The measurement is memorized and then processed. If a photon appears on the detector during the processing time, it will be ignored. This operating mode is particularly penalizing in nuclear medicine.

However, many technical fields and particularly surgery, require the use of a gamma camera to efficiently detect signals with an amplitude similar to the amplitude of electronic noise. In this case, the detectors have to be protected from electronic disturbances due to the processing electronics of the detected signals. This is the case particularly in the field of nuclear medicine using semiconducting detectors in which the signals to be detected are of the order of magnitude of one femtocoulomb.

In this case, the expert in the subject would conventionally use a ground plane to protect the detectors from disturbances due to electronic noise. However, adding a ground plane between the ceramic substrate and the detectors causes a first problem with the compactness of the device; the polarization components are placed elsewhere, which makes the device larger or creates a dead area within the useful area. This addition causes a second problem with the parasite capacitance added by this ground plane, which must have the smallest possible effect on the signal.

Furthermore, those skilled in the art know that the resistor/capacitor assembly must be located on the shortest path between the detector and the ASIC. But it cannot be located on the ground plane since this plane must be uniform. Furthermore, this resistor/capacitor assembly cannot be located in the ASIC because there is not enough room.

Furthermore, adding a ground plane between the ASIC and the detector on a conventional detection device like that mentioned above will increase the signal noise as described above, since the ceramic substrate on which the ASIC is fixed is thin.

DESCRIPTION OF THE INVENTION

The purpose of the invention is to overcome the disadvantages mentioned above. Consequently, it proposes a micro gamma camera used to detect signals with an order of magnitude of one femtocoulomb and locally and instantaneously outputting the detected image.

More precisely, the invention relates to a micro gamma camera comprising several gamma radiation detection devices adjacent to each other with no dead area and laid out above means of processing the information output by these detection devices, each of these detection devices comprising:

a plurality of detectors adjacent to each other to form a detection plane;

a first substrate including means of polarizing the detection plane and first means of processing the signal detected by the said detection plane;

a second substrate placed between the detection plane and the first substrate;

a ground plane placed between the first and the second substrates; and a third substrate including second and third signal processing means.

Preferably, the first, second and third substrates are each made of thick ceramic.

According to the invention, the second signal processing means may be analog and the third signal processing means may be digital, the digital means accepting or rejecting each incident gamma radiation depending on its energy, and identifying the address of each detector, in other words the pixel to be detected, in order to produce the global image.

Advantageously, detection devices comprising high voltage input planes are assembled together on the third connection substrate, for example through pins, according to a butt-jointed type assembly with no dead areas and polarized with respect to each other by connecting the high voltage planes together.

The invention also relates to a wide angle gamma camera formed by the assembly of several micro gamma cameras.

PRESENTATION OF EMBODIMENTS OF THE INVENTION

Figure 1:
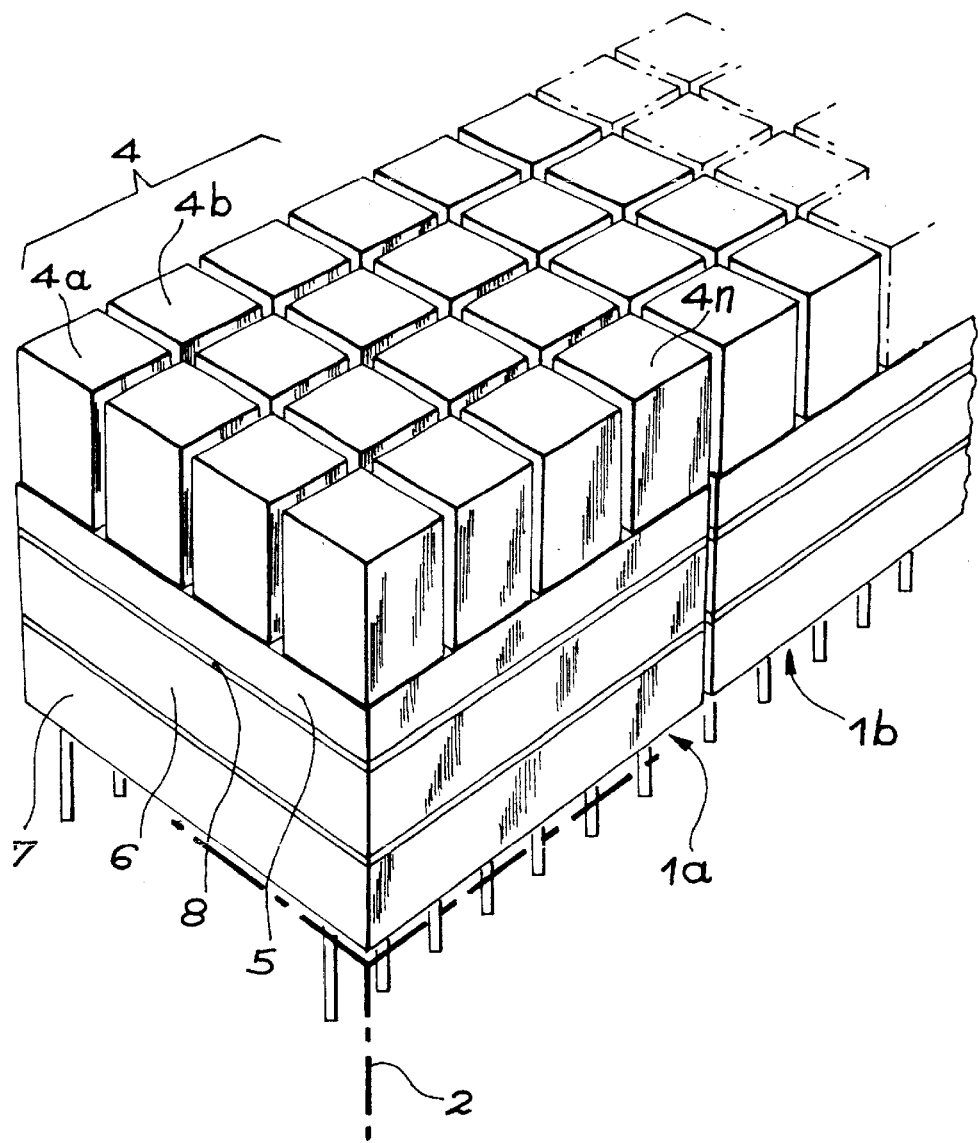
FIG. 1 diagrammatically shows a gamma camera according to the invention.

FIG. 1 diagrammatically shows a gamma camera according to the invention.

This gamma camera comprises several detection devices adjacent to each other to form the plane on which camera images are taken. These detection devices are placed above the information processing means 2; in particular, these information processing means 2 comprise conventional digital cards and analog cards that process the images output by the detection devices. In particular, these information processing means 2 shape the image, like a fault sensitivity correction or an interpolation; they also display the image. Since these means 2 are conventional, they will not be described further in this patent application.

Advantageously, the detection devices are fixed with respect to each other in order to minimize dead detection areas between the different detection devices.

According to the invention, each detection device comprises a plurality of detectors 4a, 4b, . . . , 4n adjacent to each other to form a detection plane 4. These detectors 4a, 4b, . . . , 4n form the pixels of the detection device.

These detectors may be made for example from CdZnTe; they are assembled by gluing or by welding on a second ceramic substrate reference 5.

These detector pixels directly convert the energy of the gamma photons into charge carriers. Charge carriers are collected through contacts deposited on each detector (but not shown in the figure for simplification purposes) to which a polarization high voltage is applied.

According to the invention, the second substrate 5 is made from a co-sintered multilayer ceramic known for its good mechanical tolerances, and which may be thick.

The thickness of this second substrate 5 is chosen to obtain a compromise between:

a) the quality of the mechanical strength and tolerance of the substrate;

b) the parasite capacitance that it generates;

c) the cost;

d) the possibility of making the device.

The purpose of the second substrate 5 is particularly to shield detectors against noise since they are sufficiently far from the ground plane.

This type of second substrate 5 has good mechanical strength; therefore it is easy to assemble the detectors to give the best possible contact surface in order to not leave any dead area and thus obtain a good quality image. High precision in the positioning of each detector in the detection plane avoids creating artifacts on the acquired image at the output from the gamma camera.

The detection device also comprises a first substrate 6 separated from the second substrate 5 by a ground plane 8 and a third substrate 7 placed under the first substrate 6.

The first substrate 6 comprises detector polarization means 10b such as a resistor and a capacitor identical to those used in prior art described above. This first substrate also comprises means 10c of processing signals output from the detectors, called "ASICs".

According to the invention, this first ceramic substrate 6 is thick so that add-on components can be embedded so that there is no need to put them adjacent to the detectors, which would create dead areas. They are embedded in the ceramic since it is not technically possible to silk screen print components on a thick ceramic.

The first substrate 6 also has good mechanical strength properties, for example good resistance at variable temperatures and good resistance to humidity.

However, since this first substrate 6 is thick and is made from a sintered ceramic (which makes it impossible to use the silk screen printing process), it is impossible to make the polarization means (the capacitor and the resistor) on this substrate using conventional silk screen printing processes. Furthermore, according to the invention, the polarization capacitor and resistor are integrated in cavities 10a made in the first substrate 6, using a surface mounting technique (SMC). This manufacturing technique is conventional for printed circuits; for example, it is described in a SIEMENS® sales document entitled "The SMC technique—Introduction to surface mounting".

Means 10c of processing the signals output from the detectors, called "ASICs", are also implanted in the first substrate 6 using the same technique as described above.

The two ceramic substrates are mechanically and electronically assembled together.

Figure 2A:
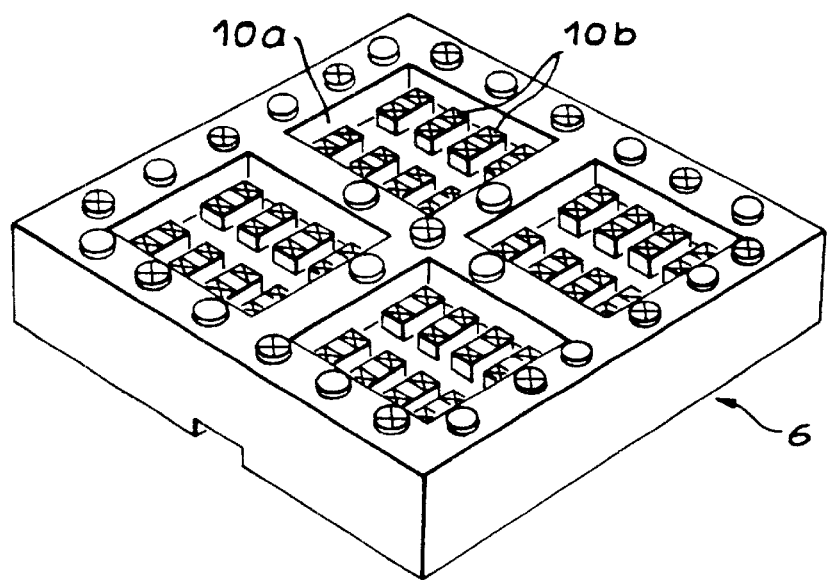
FIGS. 2A and 2B diagrammatically show a top view and a bottom view of the first substrate of the device in FIG. 1.
Figure 2B:
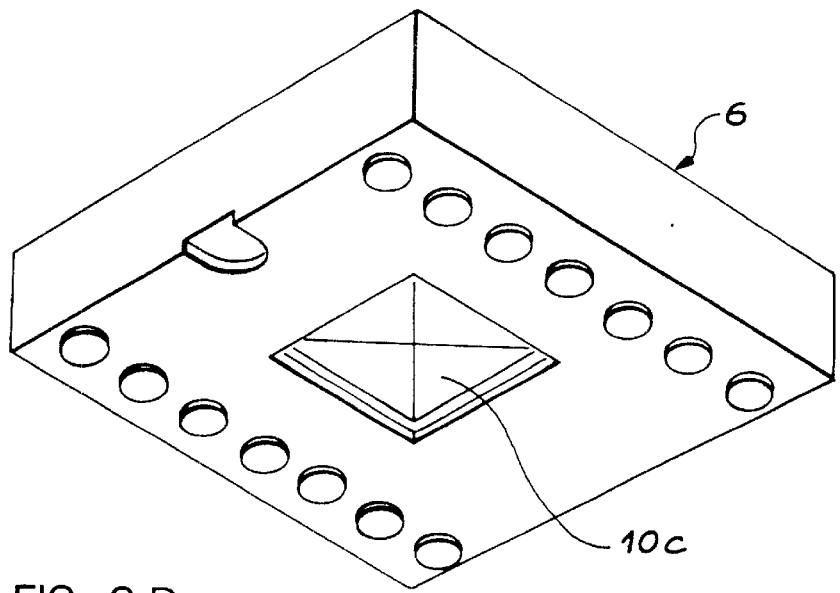

FIGS. 2A and 2B show a top view and a bottom view respectively of the first substrate 6 of the detection device. FIG. 2A shows the first substrate 6 with cavities 10a inside which the polarization components 10b, namely the polarization capacitors and resistors, are implanted.

FIG. 2B shows a bottom view of the same first substrate 6, in which an ASIC reference 10c is implanted. This ASIC amplifies and shapes the electronic signals output from the detectors.

A ground plane 8 is placed between this first substrate 6 and the second substrate 5; this ground plane is composed of a metal layer brought to a chosen voltage identical over its entire surface. The purpose of this ground plane is to protect the signals to be detected from electromagnetic disturbances originating from electromagnetic noise from the device.

Figure 3:
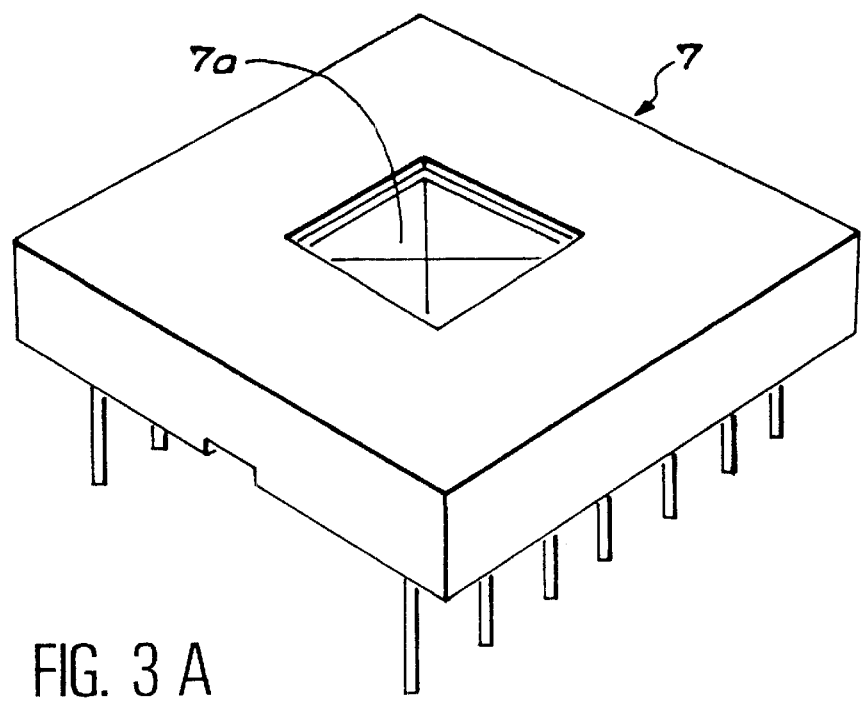
FIGS. 3A and 3B diagrammatically show a top view and a bottom view of the third substrate of the device in FIG. 1.
Figure 3:
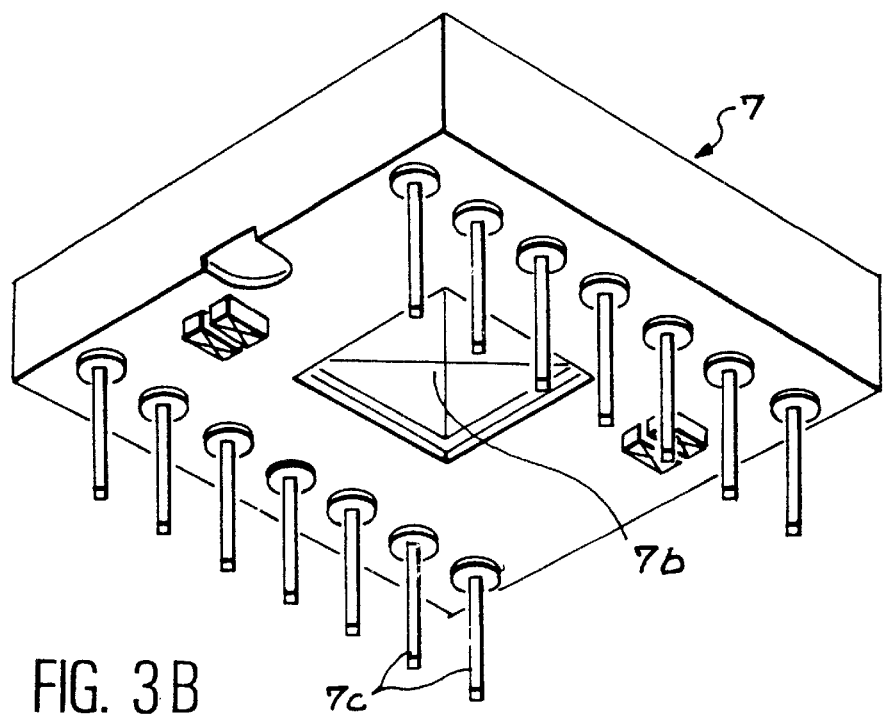

FIGS. 3A and 3B diagrammatically show a top view and a bottom view respectively of the third substrate 7 of the detection device. This third substrate 7 comprises two ASICs:

- on its upper face, it comprises an analog type ASIC 7a that processes the signal output by the ASIC 10c on the first substrate 6; for example, this processing may consist of a digitization or a correction;
- on its lower face, it comprises a digital type ASIC 7b which decides to accept or reject an event, in other words an incident γ radiation, depending on the energy deposited on the detection device. This digital ASIC also distributes accepted events to make an image.

This substrate 7 also comprises detection device output connections 7c.

Thus, according to the invention, all electronic processing applied to the signals output from the detectors is done using three independent ASICs 10c, 7a and 7b, wired in the thickness of the ceramic substrates and associated in a modular manner.

Each detection device comprises a number of detectors for each set of three substrates, that may vary as a function of the optimization of the dimensions of polarization components and ASICs. For example, the detection plane represented in FIG. 1 comprises 16 detectors. Similarly, the number of detection devices per micro camera may vary depending on the size of these devices, the dimension of the image to be obtained and the application for which the micro camera is to be used.

The micro camera made according to this description has the advantage of being compact and easily handled. It also locally and instantaneously forms the image that has good sensitivity, good energy resolution and few dead areas.

Furthermore, several micro cameras identical to the micro camera described above may be assembled together, for example on an integrated circuit board, to form a wide angle gamma camera.

What is claimed is:

1. Micro gamma camera, comprising a plurality of gamma radiation detection devices (1a, 1b, . . . , 1k) adjacent to each other with no dead area and the plurality of detection devices being laid out above means (2) of processing information output by the plurality of detection devices, each of the plurality of detection devices comprising:

a plurality of detectors (4a, 4b, . . . , 4n) adjacent to each other to form a detection plane (4);

a first substrate (6) including means (10b) of polarizing the detection plane and first means (10c) of processing the signal detected by the detection plane;

a second substrate (5) placed between the detection plane and the first substrate;

a ground plane (8) placed between the first and the second substrates; and a third substrate (7) including second and third signal processing means (7a, 7b).

2. Micro gamma camera according to claim 1, wherein the first substrate is made of a thick ceramic.

3. Micro gamma camera according to claim 1, wherein the second substrate is made of a thick ceramic.

4. Micro gamma camera according to claim 1, wherein the third substrate is made of a thick ceramic.

5. Micro gamma camera according to claim 1, wherein the second signal processing means are analog.

6. Micro gamma camera according to claim 1, wherein the third signal processing means are digital, wherein the third signal processing means accept or reject each incident gamma radiation depending on of the respective radiation energy, and wherein the third signal processing means determine the address of each detector.

7. Gamma camera according to claim 1, wherein the detection devices are assembled together on the third substrate; the detection devices being adjacent to each other and polarized with respect to each other.

8. Wide angle gamma camera, comprising a plurality of micro gamma cameras according to claim 1 assembled together.

* * * * *